United States Patent
Melanson et al.

(10) Patent No.: US 7,432,842 B1
(45) Date of Patent: Oct. 7, 2008

(54) MULTI-CHANNEL PULSE WIDTH MODULATED SIGNAL INTERLEAVE AND INVERSION

(75) Inventors: John L. Melanson, Austin, TX (US); Johann Gaboriau, Austin, TX (US); Brian D. Trotter, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/613,619

(22) Filed: Dec. 20, 2006

Related U.S. Application Data

(60) Provisional application No. 60/779,334, filed on Mar. 3, 2006.

(51) Int. Cl.
 *H03M 3/00* (2006.01)
(52) U.S. Cl. ...................... 341/152; 341/143
(58) Field of Classification Search ................ 341/143, 341/152; 318/254; 363/20, 48
 See application file for complete search history.

(56) References Cited

U.S. PATENT DOCUMENTS

| | | | |
|---|---|---|---|
| 4,386,394 A * | 5/1983 | Kocher et al. | 363/20 |
| 4,670,827 A * | 6/1987 | Schneider | 363/48 |
| 5,815,102 A | 9/1998 | Melanson et al. | 341/143 |
| 6,150,969 A | 11/2000 | Melanson | 341/143 |
| 6,362,582 B1 * | 3/2002 | Bernauer et al. | 318/254 |
| 6,480,129 B1 | 11/2002 | Melanson | 341/143 |

\* cited by examiner

*Primary Examiner*—Jean B Jeanglaude
(74) *Attorney, Agent, or Firm*—Hamilton & Terrile, LLP; Kent B. Chambers

(57) ABSTRACT

A multi-channel signal processing system reduces electromagnetic interference (EMI) by staggering pulse edges of one or more pulse-width modulated signals (PWM signals) to prevent pulse edge overlap with at least one of the other PWM signals and inverting at least one of the PWM signals. Staggering and inverting the PWM signals reduces the total EMI power at any given time generated by the multi-channel signal processing system. Pulse edges can be staggered by advancing or delaying a pulse edge for one or more channels. Pulses can be staggered and inverted using static interleave and inversion subsystems or dynamically using controllable interleave and inversion control systems. In at least one embodiment, the multi-channel signal processing system includes high power, half-bridge amplifiers for each channel. The timing and phases of the PWM signals can be determined to reduce EMI from the half-bridge amplifiers caused by the PWM signals.

25 Claims, 17 Drawing Sheets

```
(*
    When PWM signal are interleaved, there are choices to be made for the timing delays and
    phase of the outputs.  This is especially true in the case where the output will be 1/2
    bridge.
    This program analyses and finds the best timing and phases for multi-channel PWM
    outputs, and presents the results
*)
(*
Make the PWM patterns for a chip rate 64 times the pwm rate.  For demonstration, 8 different delays used*)
pwmover = 64; fs = pwmover*375000.;
pwm50 = Table[If[i > 32, -1, 1], {i, 64}]; pwmx = Join[pwm50, pwm50, pwm50, pwm50, pwm50, pwm50, pwm50, pwm50];
pwm = Table[RotateRight[pwmx, (i-1)*4], {i, 8}];
s135[x_] := Module[{n = Length[x], k = 8, p}, (* calculate harmonic strenght *)
    p = Fourier[x] / Sqrt[n];
    {20 Log[10, Abs[p[[k+1]]]], 20 Log[10, Abs[p[[3k+1]]]], 20 Log[10, Abs[p[[5k+1]]]], 20 Log[10, Abs[p[[7k+1]]]]}
];
spec[x_] := Module[{n = Length[x], p}, (* plot the spectrum of a stream *)
    p = Abs[Take[Fourier[x], n/2]] / Sqrt[n] + 10^-6;
    ListPlot[20 * Log[10, p], PlotRange -> {-30, 20}, PlotJoined -> True, GridLines -> Automatic];
    Print[s135[x]];
];
(* Show the spectrum for 3 cases with 8 channels
    All channels in phase, no delays
    All channels staggered
    All channels ataggered, but alternating phase
*)
spec[pwm[[1]] * 8];
spec[pwm[[1]] + pwm[[2]] + pwm[[3]] + pwm[[4]] + pwm[[5]] + pwm[[6]] + pwm[[7]] + pwm[[8]]];   ← 602
spec[pwm[[1]] - pwm[[2]] + pwm[[3]] - pwm[[4]] + pwm[[5]] - pwm[[6]] + pwm[[7]] - pwm[[8]]];   ← 604
```

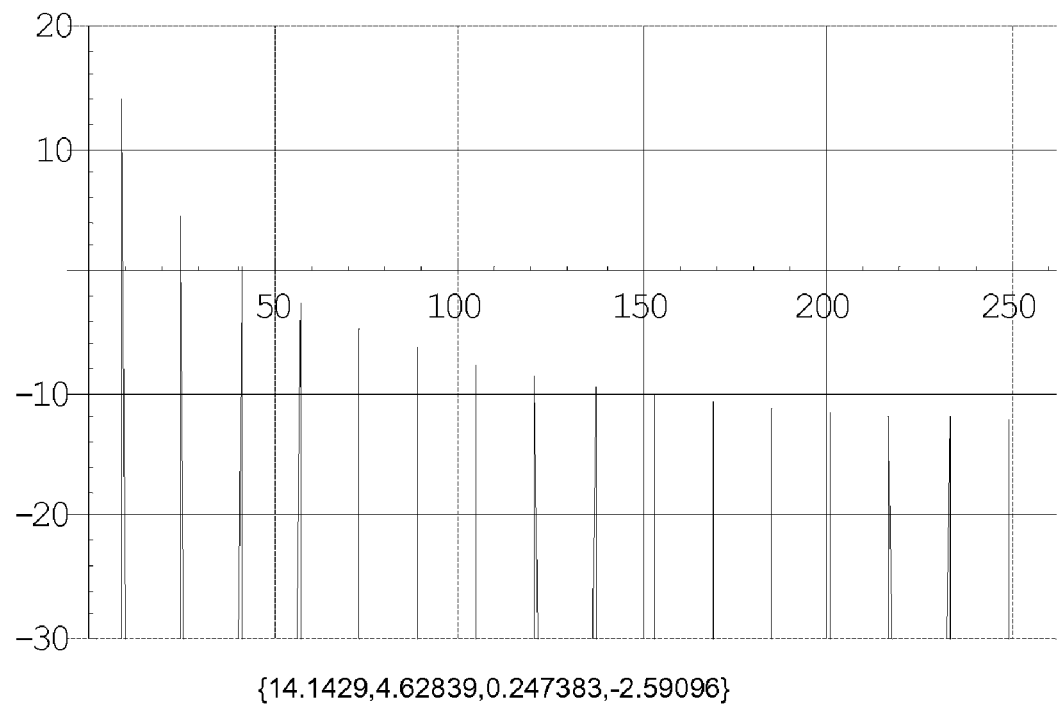
{14.1429,4.62839,0.247383,-2.59096}
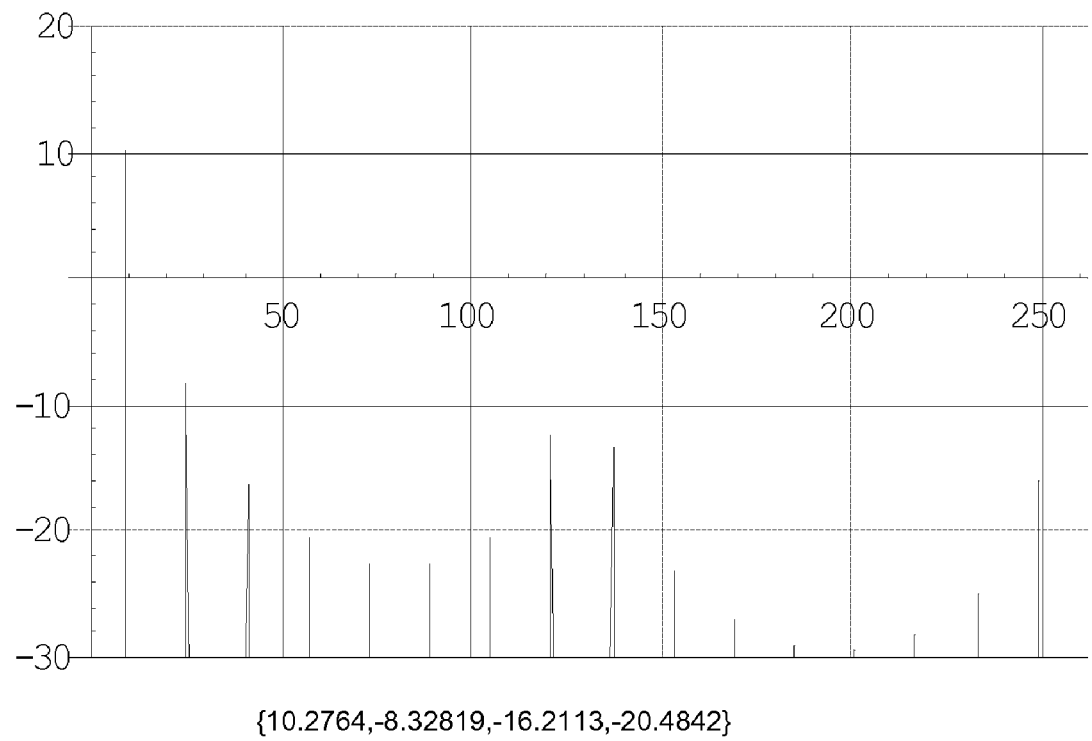
{10.2764,-8.32819,-16.2113,-20.4842}
FIGURE 7

{-3.75039,-11.8303,-12.7092,-6.45747}

```
(*
Search for good choices for the 6 channel mode.
    3 possible delays used, and all possible phase combinations
*)
out={};
Do[
   Do[
      y=IntegerDigits[i-1+32,2,6]*2-1;
      select=
         {{1,2,3,4,5,6},{1,2,3,4,5,7},{1,2,3,4,6,7}}
            [[pat]];
      x=Sum[y[[k]]*pwm[[(select[[k]])]],{k,6}];
      harm=s135[x];
      If[harm[[2]]<-10,
         out=Join[out,{Join[y*select,harm]}]
      ],
      {i,32}],
   {pat,3}];
Print[MatrixForm[out]];
```

```
1 -2 -3 -4 -5 -6   8.09573   -10.9484  -11.2143  -18.2114
1 -2 -3  4 -5 -6   2.50107   -15.1596   -5.5138  -17.7349
1 -2  3 -4  5 -6  -4.43808   -20.1735  -21.0524   -7.14517
1 -2  3  4 -5  6  -0.935933  -34.2003   -7.02564 -10.6473
1  2 -3  4 -5 -6   3.62685   -11.5607   -7.61873 -12.6476
1  2 -3  4  5 -6   2.50107   -15.1596   -5.5138  -17.7349
1  2  3  4  5 -6   8.09573   -10.9484  -11.2143  -18.2114
1  2  3  4  5  6   9.58868   -16.6714  -24.5546  -21.1719
1 -2 -3  4 -5  7  -3.41392   -12.2248   -4.98946 -16.8662
1 -2  3 -4 -5 -7   4.2416    -19.8803  -12.645   -9.2107
1 -2  3  4 -5  7  -3.41392   -12.2248   -4.98946 -16.8662
1 -2  3  4  5  7   5.59687   -13.9382   -8.63343 -12.9564
1  2 -3  4 -5 -7   4.2416    -19.8803  -12.645   -9.2107
1  2  3 -4  5 -7   5.59687   -13.9382   -8.63343 -12.9564
1  2  3  4  5 -7   8.90605   -12.9284  -14.0279  -19.4442
1  2  3  4  5  7   8.90605   -12.9284  -14.0279  -19.4442
1 -2 -3  4 -6  7  -7.1569    -13.9526   -4.30682 -27.3929
1 -2  3 -4 -6 -7   4.65198   -15.2368  -33.6446   -8.57972
1 -2  3 -4 -6  7  -5.64506   -10.5156  -11.3944   -8.35215
1 -2  3 -4  6 -7  -5.64506   -10.5156  -11.3944   -8.35215
1 -2  3  4 -6  7  -1.43389   -10.9921   -5.79978 -14.0527
1 -2  3  4  6  7   5.26983   -16.8369   -7.19113 -14.9662
1  2 -3 -4 -6 -7   6.86987   -10.4504   -7.80897 -41.4197
1  2 -3  4 -6 -7   5.26983   -16.8369   -7.19113 -14.9662
1  2 -3  4 -6 -7  -1.43389   -10.9921   -5.79978 -14.0527
1  2  3  4  6 -7   8.15413   -29.2636  -19.6179  -12.0819
```

(*
Show the spectrum of some of the better cases  Note that there is a larce swing in the harmonic output
*)

spec[pwm[[1]] * 6];

spec[pwm[[1]] + pwm[[2]] + pwm[[3]] + pwm[[4]] + pwm[[5]] + pwm[[6]]];

spec[pwm[[1]] - pwm[[2]] + pwm[[3]] - pwm[[4]] + pwm[[5]] - pwm[[6]]];

spec[pwm[[1]] - pwm[[2]] + pwm[[3]] + pwm[[4]] - pwm[[5]] + pwm[[6]]];

spec[pwm[[1]] - pwm[[2]] + pwm[[3]] - pwm[[4]] - pwm[[5]] - pwm[[7]]];

spec[pwm[[1]] - pwm[[2]] - pwm[[3]] + pwm[[4]] - pwm[[6]] + pwm[[7]]];

spec[pwm[[1]] - pwm[[2]] + pwm[[3]] - pwm[[5]] + pwm[[6]] - pwm[[7]]];

FIGURE 9

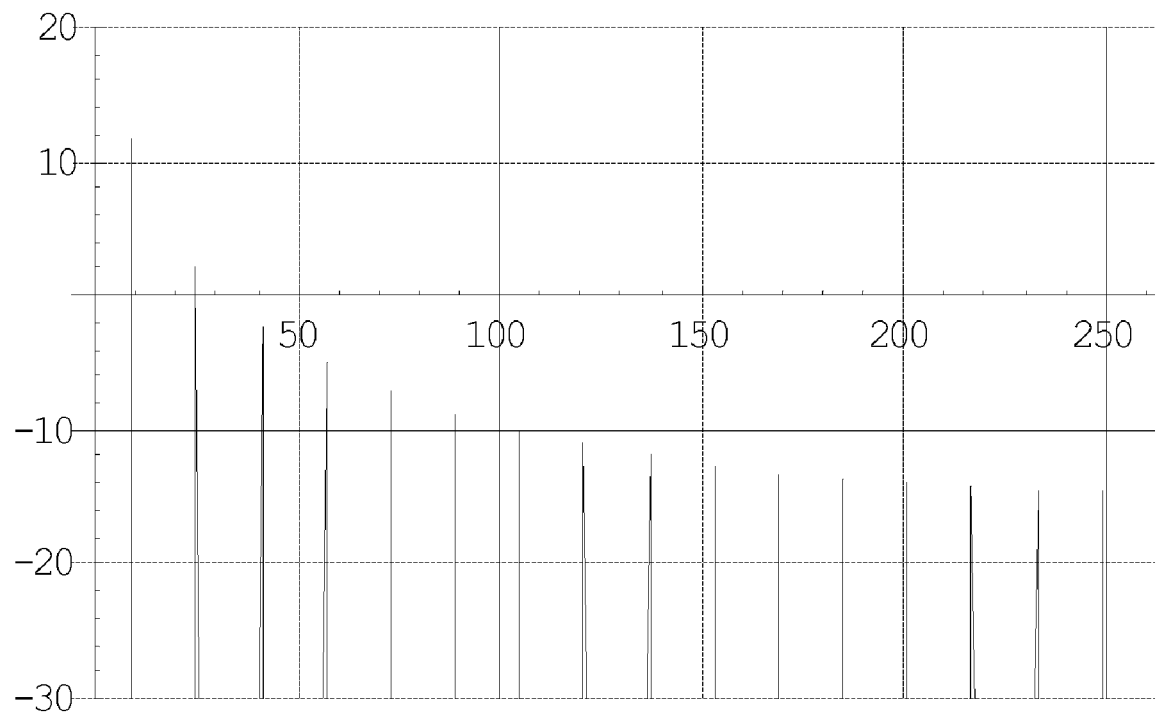
{11.6441,2.12962,-2.25139,-5.08973}
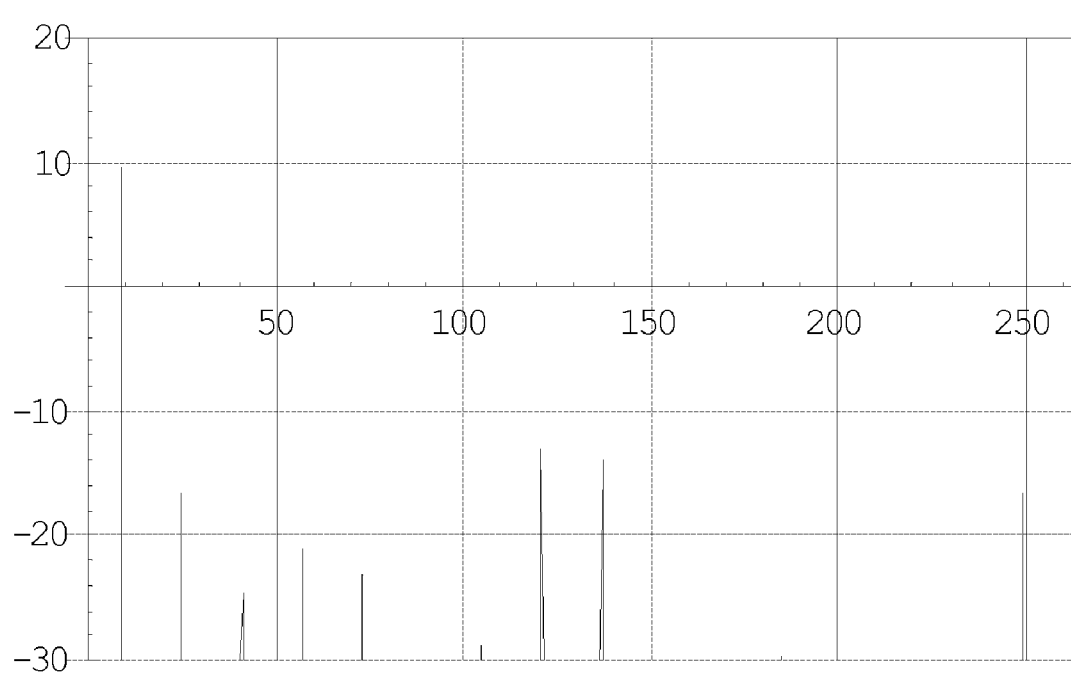
{9.58868,-16.6714,-24.5546,-21.1719}
FIGURE 10

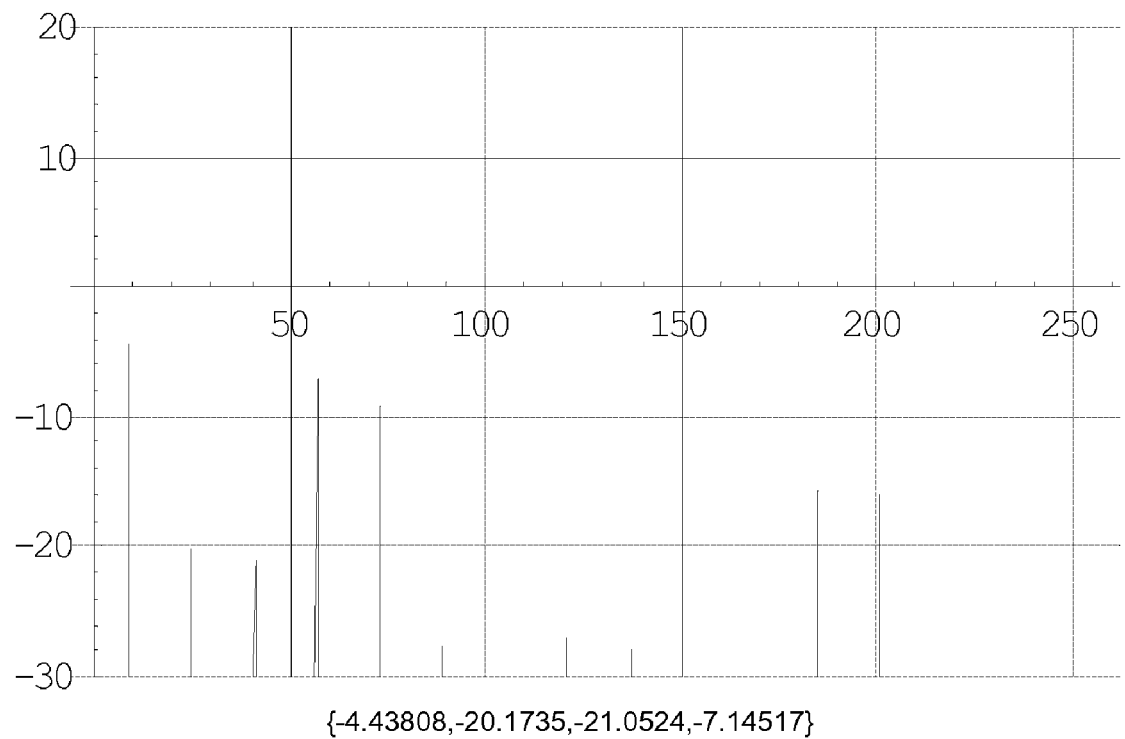
{-4.43808,-20.1735,-21.0524,-7.14517}
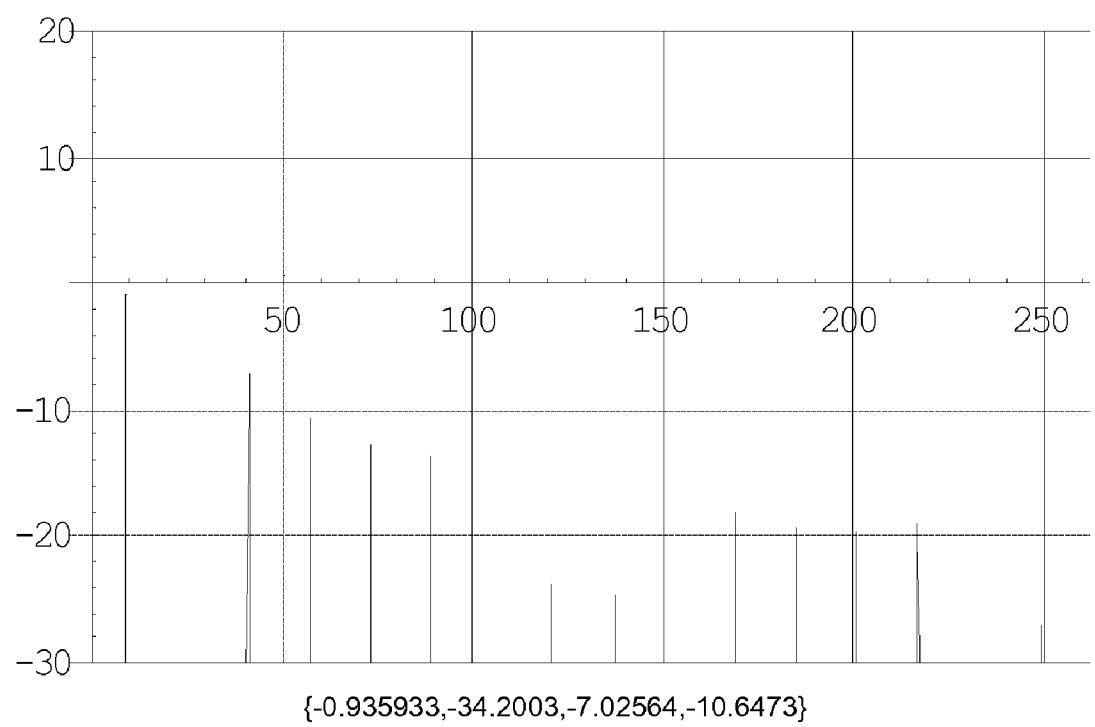
{-0.935933,-34.2003,-7.02564,-10.6473}
FIGURE 11

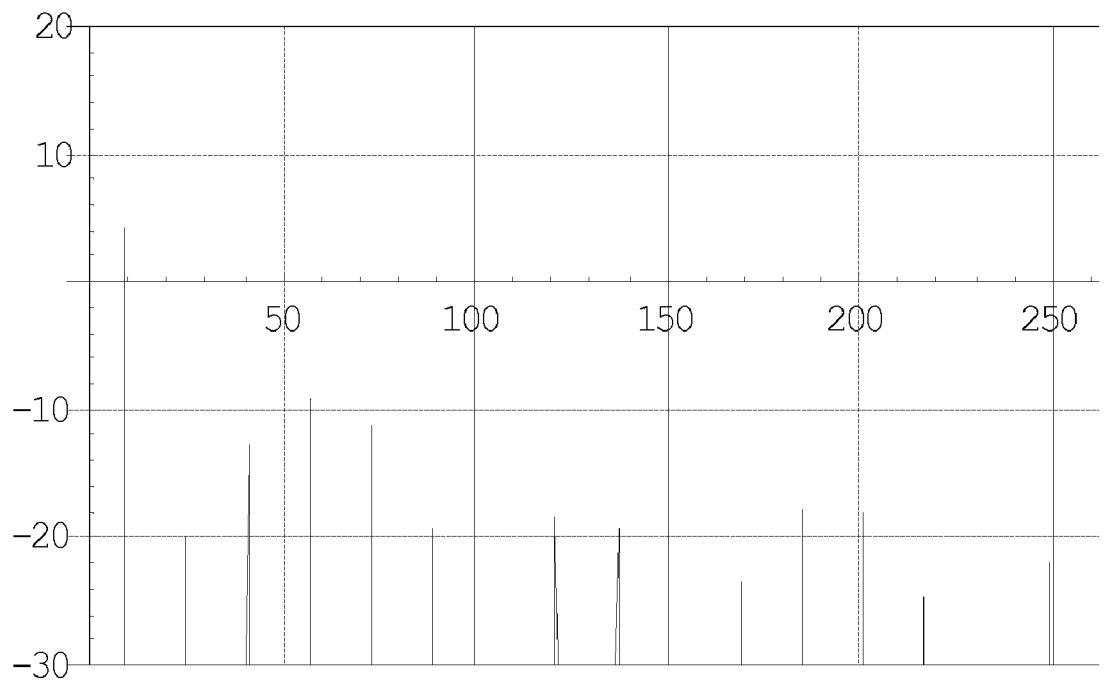
{4.2416,-19.8803,-12.645,-9.2107}
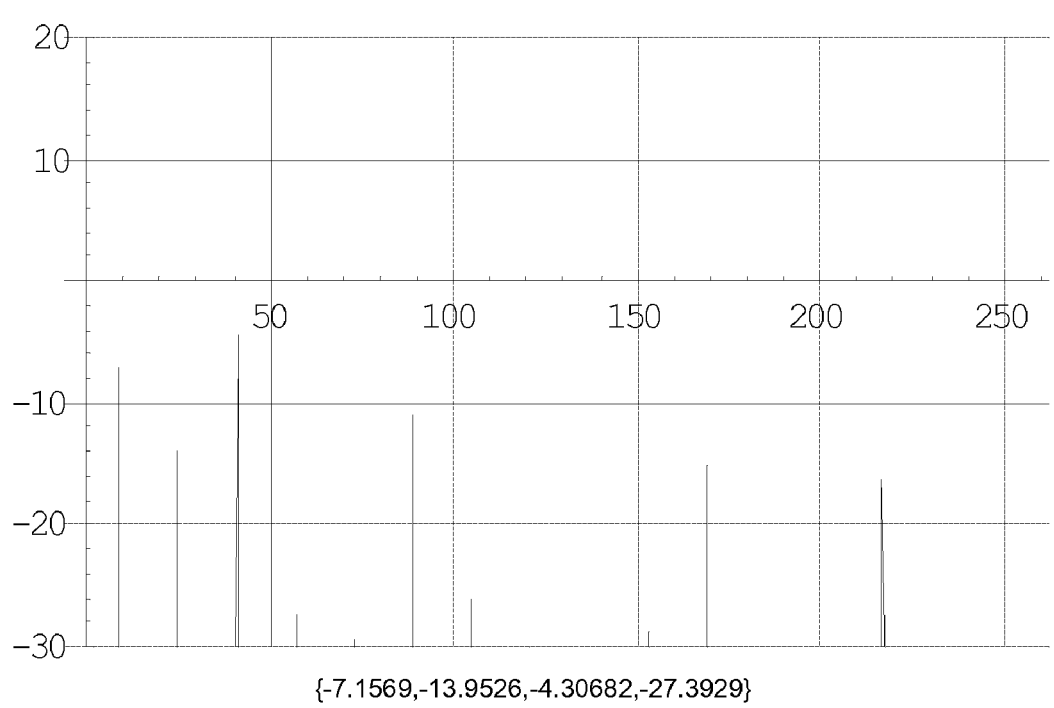
{-7.1569,-13.9526,-4.30682,-27.3929}
FIGURE 12

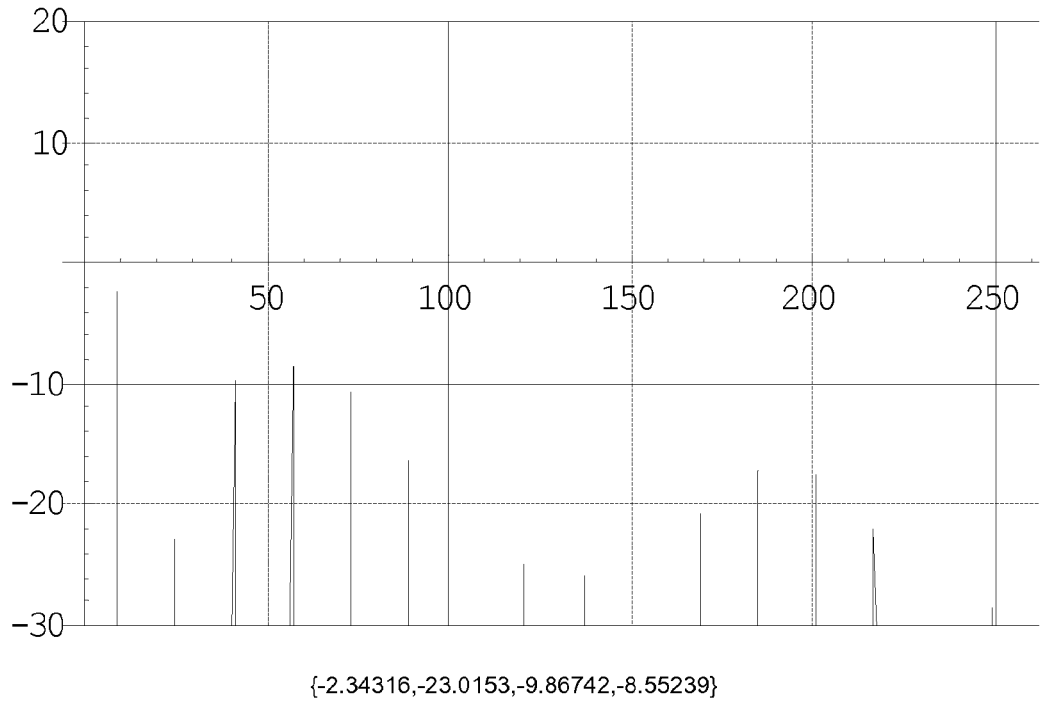

{-2.34316,-23.0153,-9.86742,-8.55239}

```
(*
Plot the spectrum and the 6 pwm patterns for one of the cases
  The spectrum is significantly reduced for many of the harmonics.
*)                                                                        606
spec[pwm[[1]] - pwm[[2]] - pwm[[3]] + pwm[[4]] - pwm[[6]] + pwm[[7]]];
ListPlot[Take[pwm[[1]] - pwm[[2]] - pwm[[3]] + pwm[[4]] - pwm[[6]] + pwm[[7]], 64*2], PlotJoined → True];
ListPlot[Take[pwm[[1]], 192], PlotJoined → True];
ListPlot[Take[-pwm[[2]], 192], PlotJoined → True];
ListPlot[Take[-pwm[[3]], 192], PlotJoined → True];
ListPlot[Take[pwm[[4]], 192], PlotJoined → True];
ListPlot[Take[-pwm[[6]], 192], PlotJoined → True];
ListPlot[Take[pwm[[7]], 192], PlotJoined → True];
```

FIGURE 13

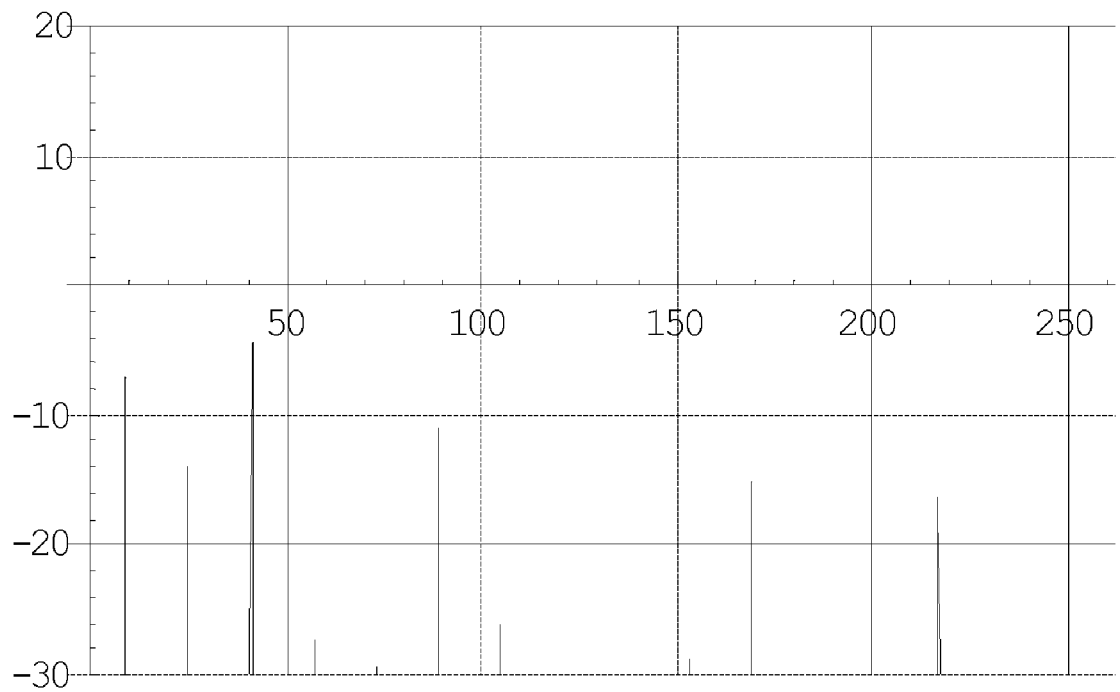
{-7.1569,-13.9526,-4.30682,-27.3929}
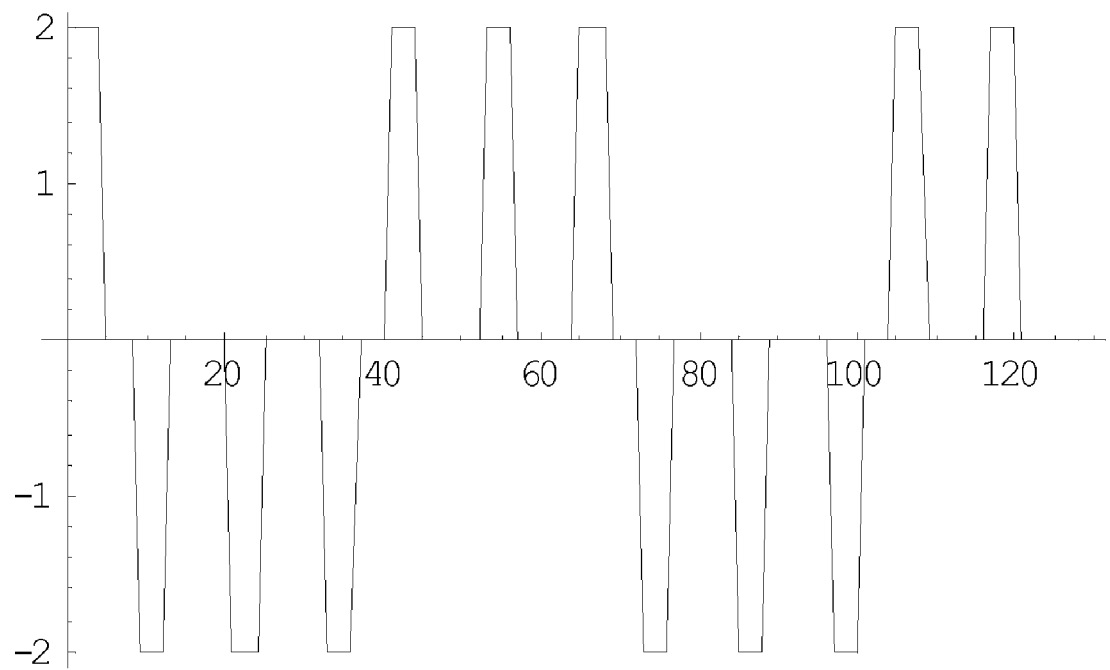
FIGURE 14

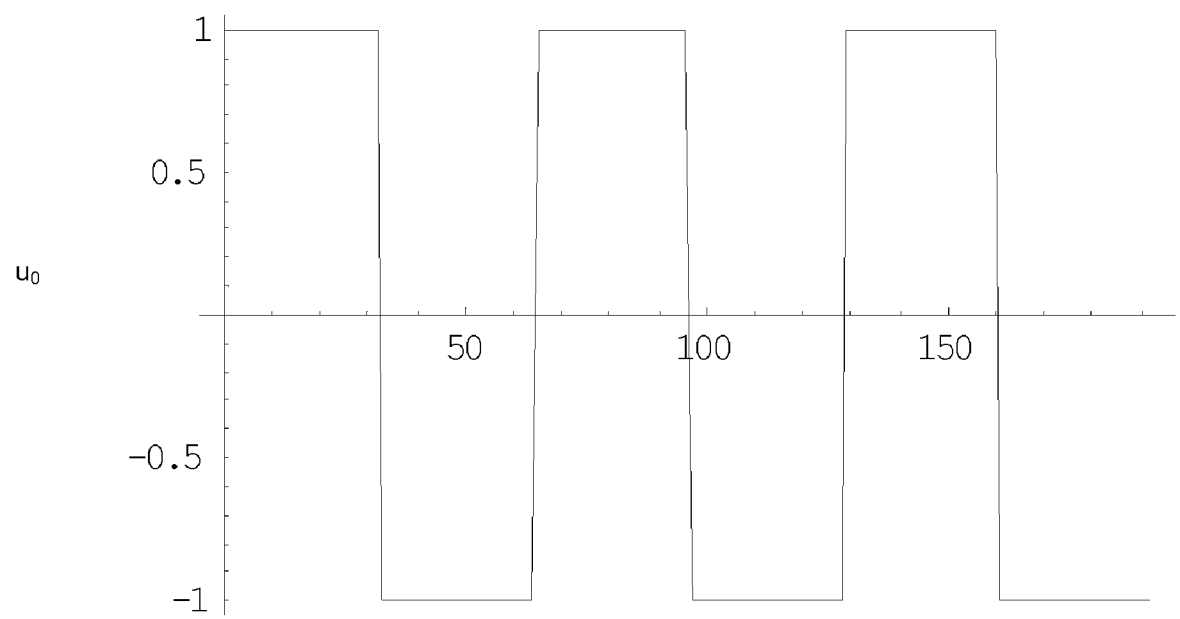
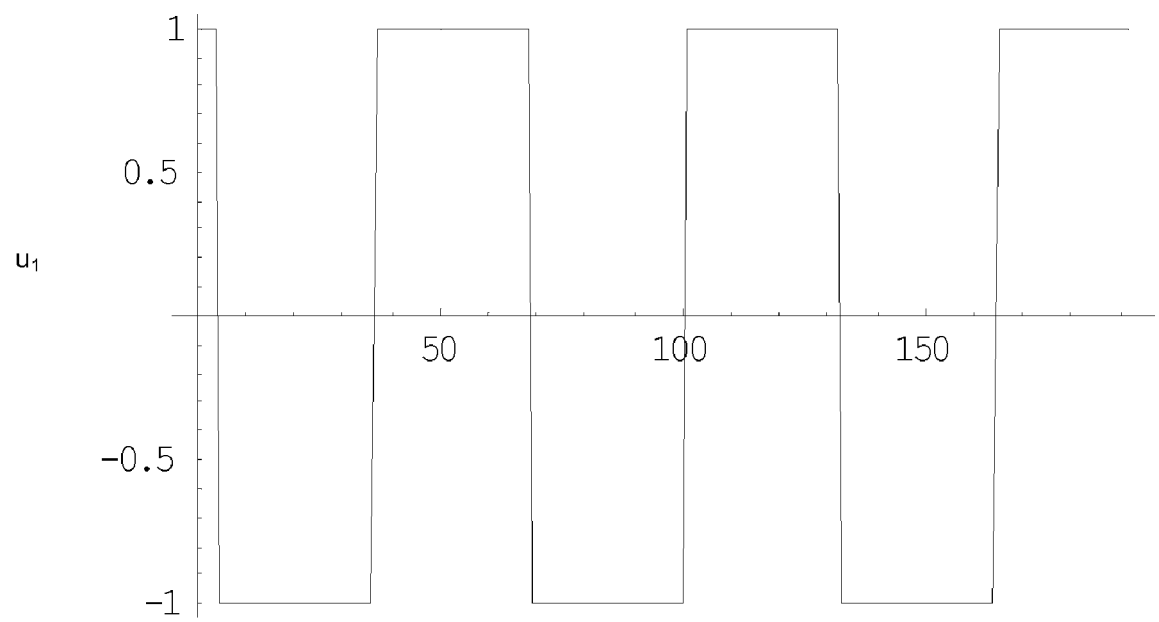
FIGURE 15

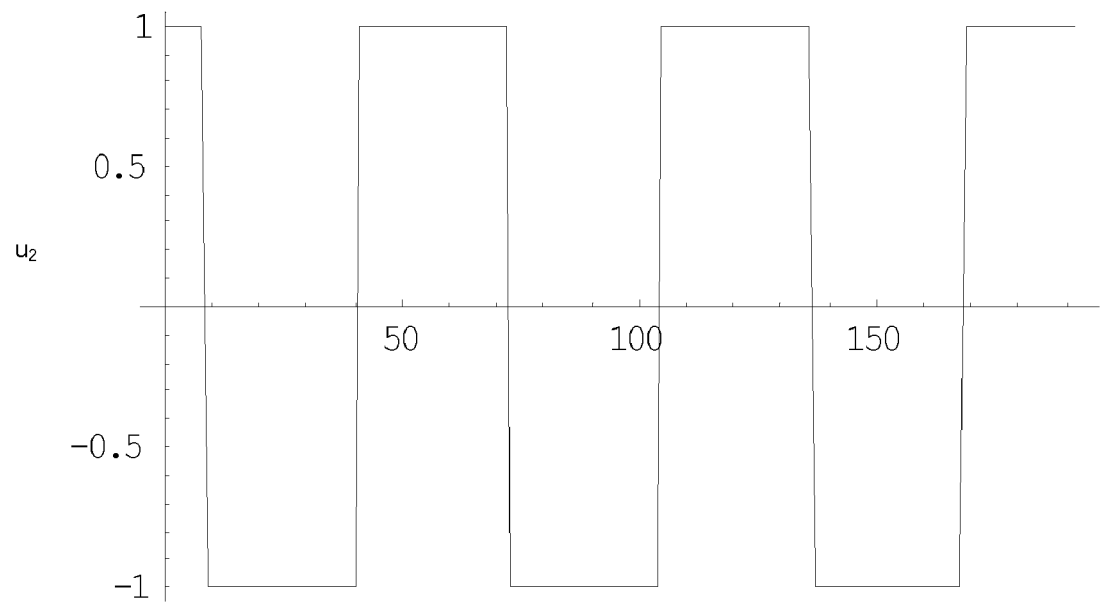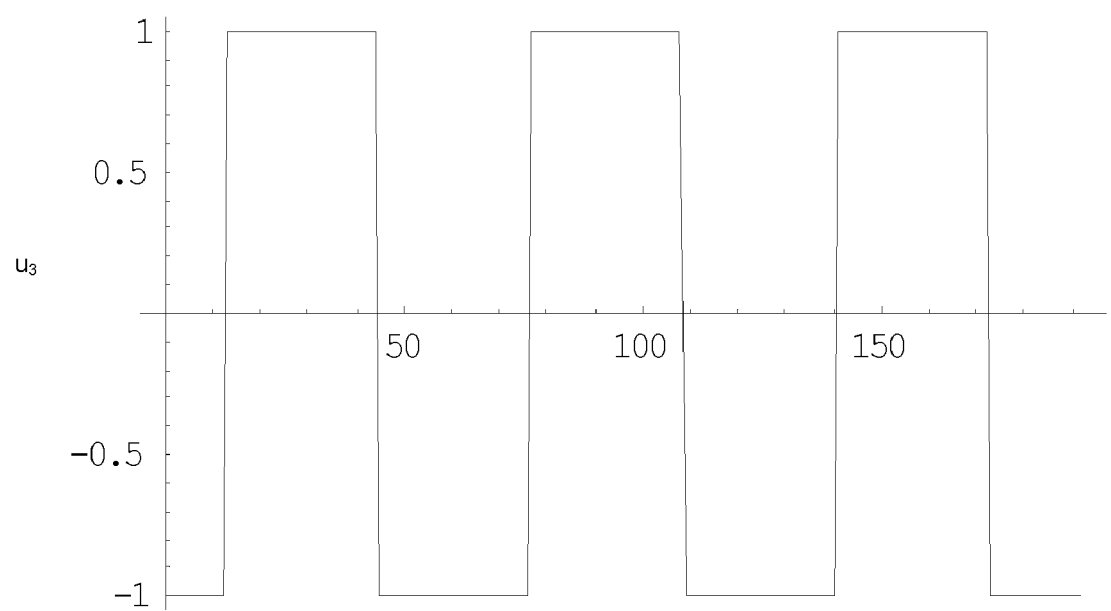
FIGURE 16

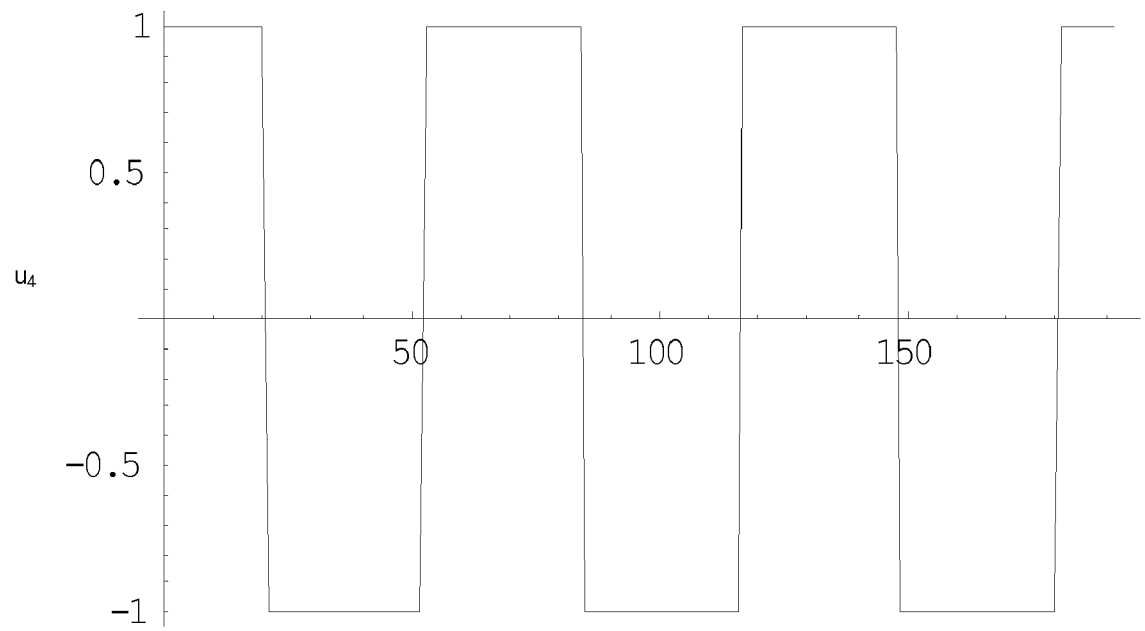
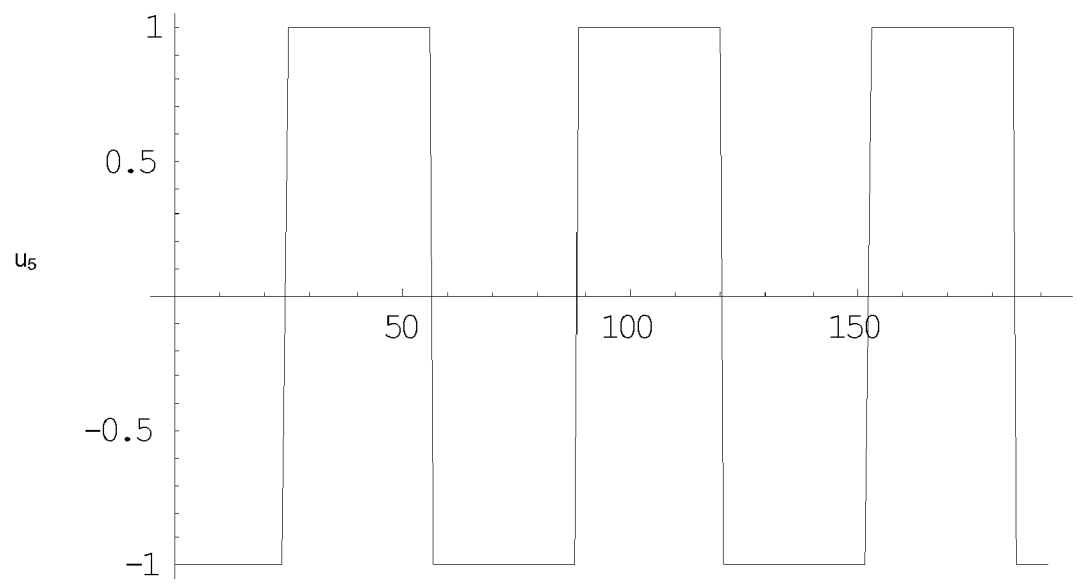
FIGURE 17

MULTI-CHANNEL PULSE WIDTH MODULATED SIGNAL INTERLEAVE AND INVERSION

CROSS-REFERENCE TO RELATED APPLICATION

This application claims the benefit under 35 U.S.C. § 119 (e) and 37C.F.R. § 1.78 of U.S. Provisional Application No. 60/779,334, filed Mar. 3, 2006 and entitled "Half Bridge Interleave for Pulse Width Modulation (PWM) Radio Frequency Interference (RFI)". The U.S. Provisional Application No. 60/779,334 includes exemplary systems and methods and is incorporated by reference in its entirety.

BACKGROUND OF THE INVENTION

1. Field of the Invention

The present invention relates in general to the field of information processing, and more specifically to a system and method for interleaving and inverting multi-channel pulse width modulated signals.

2. Description of the Related Art

Signal processing systems utilize pulse width modulators (PWMs) in many signal processing applications. Pulse-width modulators generally modulate a duty cycle of a nearly pure square waveform to vary an average value of the waveform. FIG. 1 depicts a multi-channel audio system 100 that utilizes multiple PWMs 102.0 through 102.M (collectively referred to as PWMs 102) to drive associated half-bridge amplifiers 104.0 ... 104.M. "M" is an integer greater than one (1), and M+1 represents the number of channels in the multi-channel audio system 100. Channels 0 ... M represent respective signal paths in multi-channel audio system 100. For example, a 5.1 multi-channel stereo system has 6 channels for six respective speakers.

A multi-channel digital signal source 101, such as a multi-channel audio signal processing system, provides M digital input signals $x_0(n) \ldots x_M(n)$ to the PWMs 102. Input signals $x_0(n) \ldots x_M(n)$ represent data for the respective 0 ... M channels of multi-channel audio system 100. The PWMs 102 respectively convert the digital input signals $x_0(n) \ldots x_M(n)$ into pulse width modulated output signals $u_0, \ldots, u_M$.

Half-bridge amplifiers are ubiquitous and, in general, switch an output signal between two voltage levels such as +V and $V_{REF}$. "+V" generally represents a voltage source that can be any value and, in power applications, can range from, for example, +15V to +100V. $V_{REF}$ is less than +V and is often ground or –V, e.g. –15V to –100 V. Half-bridge amplifiers 104 conceptually illustrate the switching nature of half-bridge amplifiers in general. Each of the half-bridge amplifiers 104 includes two conceptual groups of switches 106 and 108. Switches 106 and 108 are complementary; thus, switches 106 conduct when switches 108 are in an essentially open, high impedance state and visa versa. When the pulse width modulated output signals $u_0, \ldots, u_M$ are logical ones, switches 106 conduct and drive half-bridge output signals $p_0 \ldots p_M$ to approximately +V. When the pulse width modulated output signals $u_0, \ldots, u_M$ are logical zeros, switches 108 conduct and drive half-bridge output signals $p_0 \ldots p_M$ to approximately $V_{REF}$ and cause switches 106 open. Half-bridge amplifiers 104 can be implemented in many ways using, for example, power transistors and diode bridge networks.

The low pass filters 110.0 through 110.M respectively average the half-bridge output signals $p_0 \ldots p_M$ to respectively generate respective continuous time audio output signals $y_0(t) \ldots y_M(t)$ of respective audio channels 0 ... M. Audio output signals $y_0(t) \ldots y_M(t)$ drive speakers 112.0 ... 112.M to produce audio frequency sound waves.

FIG. 2 depicts multi-channel pulse width modulated output signals $u_0, \ldots, u_M$ 200. Pulse width modulated output signals $u_0, \ldots, u_M$ have respective rising edges at time $t_0$, $t_2$, $t_4$, and $t_6$, ..., such as rising edges 202.0 ... 202.M, and respective falling edges at times $t_1$, $t_3$, $t_5$, and $t_7$, such as falling edges 204.0 ... 204.M. Each of the output signals $u_0, \ldots, u_M$ is a series of frames with each frame having a period T equal to $t_i - t_{i+1}$. Each frame of output signals $u_0, \ldots, u_M$ has a respective PWM pattern. The duty cycle of each frame of output signals $u_0, \ldots, u_M$ equals the pulse width duration divided by the period T times 100%. The duty cycles of output signals $u_0, \ldots, u_M$ depicted in FIG. 2 are each 50%, which is representative of a very low-level signal.

When PWMs are operated, there is a significant issue with electromagnetic interference (EMI). The sum of the pulse voltage amplitudes of the output signals $u_0, \ldots, u_M$ at any given time is directly proportional to the total EMI power of multi-channel audio system 100. These radio frequency (RF) signals are created by the large voltages and currents that are switched at moderate frequencies. These voltages may be 30 volts, 5 amps switched at 384 kHz, as an example. It is difficult to shield this RF energy from leaking into the rest of the multi-channel audio system 100, other adjacent systems, or violating governmental regulatory EMI standards. At high signal levels, the amount variation of the pulse edges over time reduces the peak EMI levels at any given time, tempering the situation to some extent. At low level audio signals, the PWM signals are nearly pure square waves. As these square waves are at 250-500 kHz in most applications, harmonics of the signals can be very strong in the MHz region. AM radio, and even FM radio, reception can be compromised.

SUMMARY OF THE INVENTION

In one embodiment of the present invention, a method of processing pulse width modulated signals (PWM signals) in a multi-channel signal processing system includes receiving N PWM signals for N-channels of the signal processing system, wherein N is an integer greater than one. The method further includes staggering pulse edges of at least one of the PWM signals to prevent pulse edge overlap with at least one of the other PWM signals and inverting at least one of the PWM signals.

In another embodiment of the present invention, a multi-channel signal processing system includes a multi-channel pulse width modulation signal processor to generate pulse width modulated signals (PWM signals) for multiple channels. The system further includes an interleaving subsystem, coupled to the processor, to stagger pulse edges of at least one of the PWM signals to prevent pulse edge overlap with at least one of the other PWM signals. The system also includes an inverter subsystem, coupled to the interleaving subsystem, to invert at least one of the PWM signals.

In a further embodiment of the present invention, a multi-channel signal processing system includes means for receiving N pulse width modulated signals (PWM signals) for N-channels of the signal processing system, wherein N is an integer greater than one. The system further includes means for staggering pulse edges of at least one of the PWM signals to prevent pulse edge overlap with at least one of the other PWM signals. The system also includes means for inverting at least one of the PWM signals.

BRIEF DESCRIPTION OF THE DRAWINGS

FIGS. 6 through 17 depict an exemplary stagger and inversion determination process.

The present invention may be better understood, and its numerous objects, features and advantages made apparent to those skilled in the art by referencing the accompanying drawings. The use of the same reference number throughout the several figures designates a like or similar element.

DETAILED DESCRIPTION

A multi-channel signal processing system reduces electromagnetic interference (EMI) by staggering pulse edges of one or more pulse-width modulated signals (PWM signals) to prevent pulse edge overlap with at least one of the other PWM signals and inverting at least one of the PWM signals. Staggering and inverting the PWM signals reduces the total EMI power at any given time generated by the multi-channel signal processing system. Pulse edges can be staggered by advancing or delaying a pulse edge for one or more channels. Pulses can be staggered and inverted using static interleave and inversion subsystems or dynamically using controllable interleave and inversion control systems. In at least one embodiment, the multi-channel signal processing system includes high power, half-bridge amplifiers for each channel. The timing and phases of the PWM signals can be determined to reduce EMI from the half-bridge amplifiers caused by the PWM signals.

Figure 1:
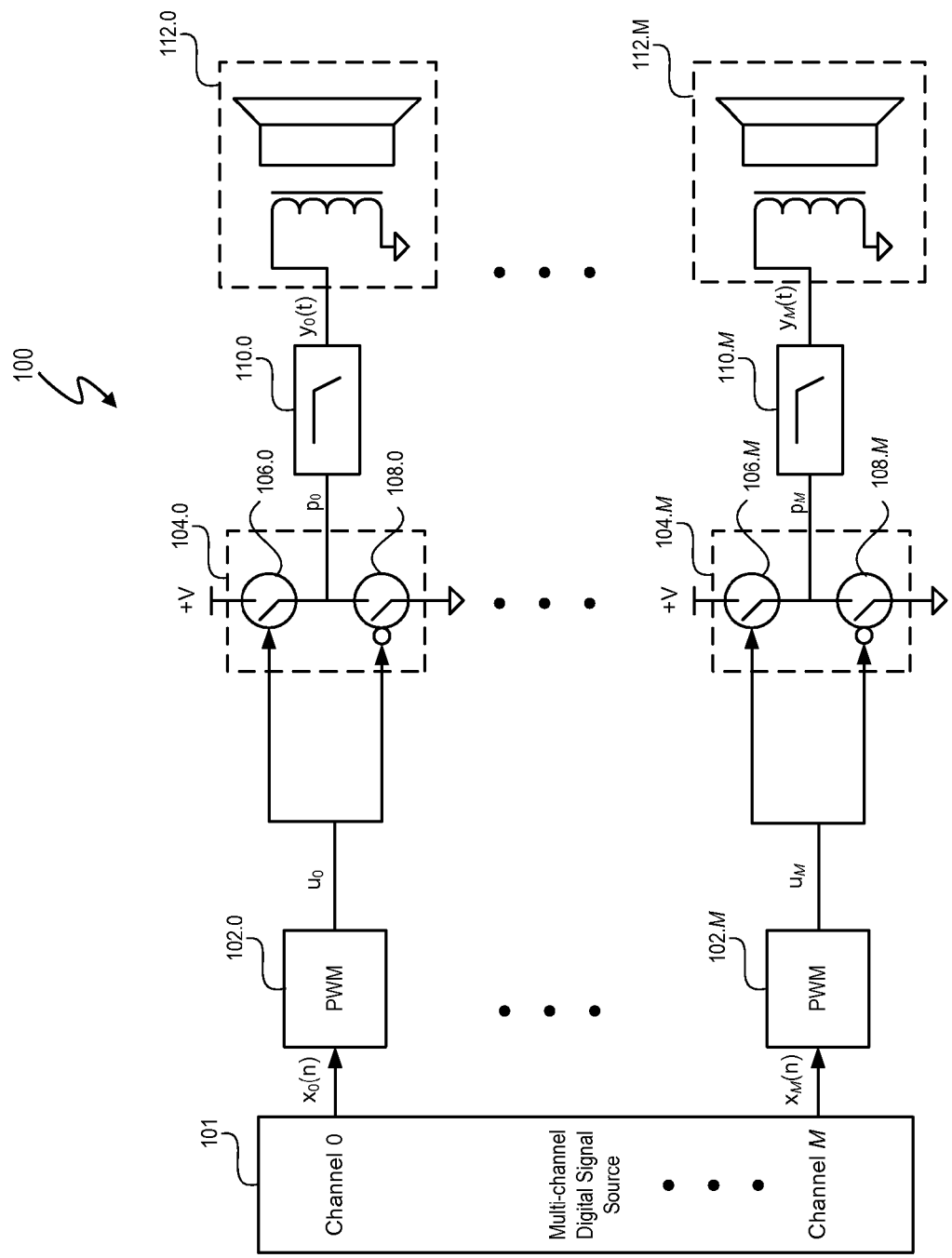
FIG. 1 (labeled prior art) depicts a multi-channel audio system that utilizes multiple pulse width modulators.
Figure 2:
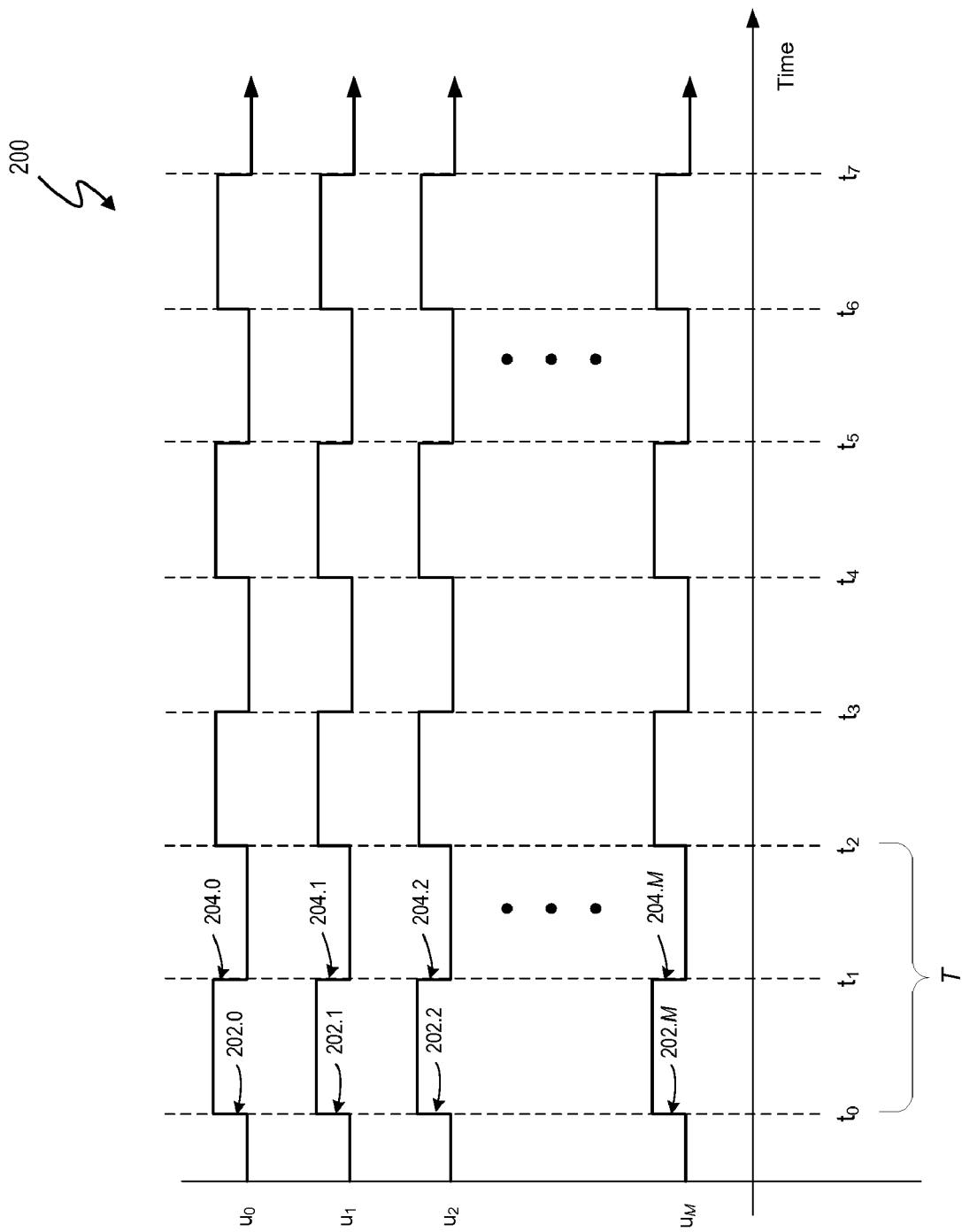
FIG. 2 (labeled prior art) depicts multi-channel pulse width modulated output signals for at least one embodiment of the multi-channel audio system of FIG. 1.
Figure 3:
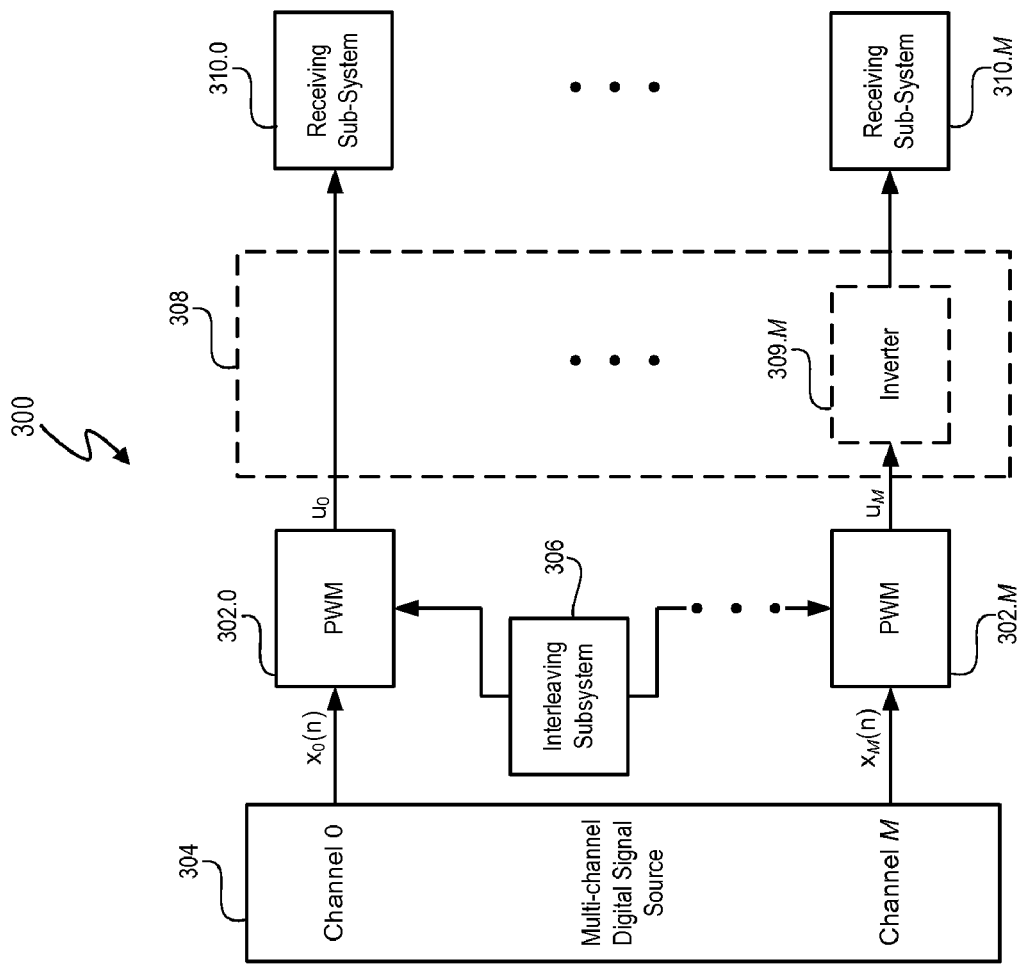
FIG. 3 depicts an exemplary multi-channel signal processing system that staggers and inverts selected pulse width modulated signals.

FIG. 3 depicts an exemplary multi-channel signal processing system 300 that staggers and inverts selected PWM signals to reduce total EMI generated by multi-channel signal processing system 300. The multi-channel signal processing system 300 includes a multi-channel digital signal source 304, which in at least one embodiment is a multi-channel audio signal processing system. The multi-channel digital signal source 304 generates digital input signals $x_0(n) \ldots x_M(n)$ for respective channels $0 \ldots M$. Input signals $x_0(n) \ldots x_M(n)$ represent data for the respective $0 \ldots M$ channels of multi-channel signal processing system 300. Channels $0 \ldots M$ represent respective signal paths in multi-channel signal processing system 300. In at least one embodiment, multi-channel digital signal source 304 includes multiple delta sigma modulators, and the M digital input signals $x_0(n) \ldots x_M(n)$ represent quantizer output signals from the delta sigma modulators.

In at least one embodiment, the M+1 input signals $x_0(n) \ldots x_M(n)$ are provided to respective pulse width modulators (PWMs) 302.0 through 302.M (collectively referred to as PWMs 302). The PWMs 302 convert signals $x_0(n) \ldots x_M(n)$ into respective pulse width modulated output signals (PWM output signals) $u_0 \ldots u_M$.

The multi-channel signal processing system 300 utilizes interleaving and inverting subsystems to respectively: (i) stagger the pulse edges of one or more of the PWM output signals $u_0 \ldots u_M$ to prevent pulse edge overlap with at least one of the other PWM output signals and (ii) invert at least one of the PWM signals. Interleaving subsystem 306 staggers the pulse edges of a selected set of the PWM output signals $u_0 \ldots u_M$. The pulse edges of the selected set of the PWM output signals $u_0 \ldots u_M$ can be staggered by advancing and/or delaying the pulse edges of the selected set of the PWM output signals $u_0 \ldots u_M$ to prevent the pulse edges of the selected set of the PWM output signals $u_0 \ldots u_M$ from overlapping, i.e. occurring at the same time. Additionally, the amount of stagger can be uniform or different for each of the selected PWM output signals $u_0 \ldots u_M$. Staggering the PWM output signals $u_0 \ldots u_M$ in time attenuates the peaks of the PWM output signals $u_0 \ldots$ UM spectrum in the frequency domain and, thus, reduces instantaneous EMI.

The interleaving subsystem 306 can be implemented in any of a wide variety of embodiments. In at least one embodiment, interleaving subsystem 306 is a physically separate device from the PWMs 302 or can be implemented, for example, as static delay circuitry or a delay algorithm in a software embodiment directly within the PWMs 302. In another embodiment, interleaving subsystem 306 is implemented as a series feedback loop between selected PWMs 302 to allow each of the selected PWMs 302 to stagger pulse edges based upon the pulse edge timing of a preceding one of the PWMs 302 in the feedback configuration.

In another embodiment, pulse edges of selected PWM output signals $u_0 \ldots u_M$ are staggered using a modification signal as described in commonly assigned U.S. patent application Ser. No. 11/534,417, (referred to herein as the "'417 application") entitled "Signal Processing System with Modified Delta Sigma Modulator Quantizer Output Signals to Spread Harmonic Frequencies of Pulse Width Modulator Output Signals", inventors Johann Gaboriau, John L. Melanson, Brian Trotter, filed Sep. 22, 2006. As described in the '417 application, each pulse of the PWM output signals $u_0 \ldots u_M$ has a pulse start time and a pulse end time relative to a beginning of a respective frame of each PWM signal and the modification signal causes pulse start times and pulse end times of selected PWM output signals $u_0 \ldots u_M$ to differ sufficiently from pulse start times and pulse end times of non-staggered pulse edges to reduce energy levels of at least the 3rd and 5th harmonic frequencies of the PWM signals by at least 3 dB relative to energy levels of the 3rd and 5th harmonic frequencies of PWM signals generated without staggering pulse edges.

In another embodiment, described in U.S. patent application Ser. No. 11/428,210 (referred to herein as the "'210 application") entitled "Signal Processing System with Spreading of a Spectrum of Harmonic Frequencies of a Pulse Width Modulator Output Signal", inventors Johann Gaboriau and John L. Melanson, filed Jun. 30, 2006, pulse edges of at least one of the PWM output signals $u_0 \ldots u_M$ are staggered by selecting a PWM pattern from a group of K patterns, wherein selection of the PWM pattern causes a rising edge of one or more selected PWM output signals $u_0 \ldots u_M$ to shift in time relative to a rising edge of one or more other PWM output signals $u_0 \ldots u_M$, wherein: K is an integer greater than or equal to two. The '417 application and the '210 application include exemplary systems and methods and are hereby incorporated by reference in their entirety.

In addition to staggering the PWM output signals $u_0 \ldots u_M$, multi-channel signal processing system 300 also directly or indirectly inverts PWM output signals $u_0 \ldots u_M$. Inversion of PWM output signals $u_0 \ldots u_M$ also spreads the peaks of the PWM output signals $u_0 \ldots u_M$ over time and, thus, further reduces instantaneous EMI. In at least one embodiment, multi-channel signal processing system 300 includes an inverter subsystem 308 to invert directly or indirectly invert selected PWM output signals $u_0 \ldots u_M$. FIG. 3 depicts inverter subsystem 308 with dotted lines because the inverter subsystem 308 can be configured as depicted to directly invert selected PWM output signals $u_0 \ldots u_M$ or configured to indirectly invert PWM output signals no $\ldots u_M$ by, for example, inverting one or more signals $x_0(n) \ldots x_M(n)$ prior to reception by the PWMs 302.

In at least one embodiment, the channels selected for inversion include an inverter, such as inverter 309.M, in the signal path of the selected channel between the multi-channel digital signal source 304 and the receiving subsystems 310.0 . . . 310.M. FIG. 3 depicts the selection of channel M for inversion using inverter 309.M. The inverter 309.M is depicted with dotted lines to indicate that the determination of which signals to invert is a matter of design choice. The determination of which signals to invert is subsequently described in more detail.

Multi-channel signal processing system 300 provides the PWM output signals $u_0 \ldots u_M$, with selected staggering and inversion, to respective receiving subsystems 310.0 . . . 310.M. In at least one embodiment, subsystems 310 respectively include half-bridge amplifiers 104.0 . . . 104.M, low pass filters 110.0 . . . 110.M, and speakers 112.0 . . . 112.M, which function as previously described.

Figure 4:
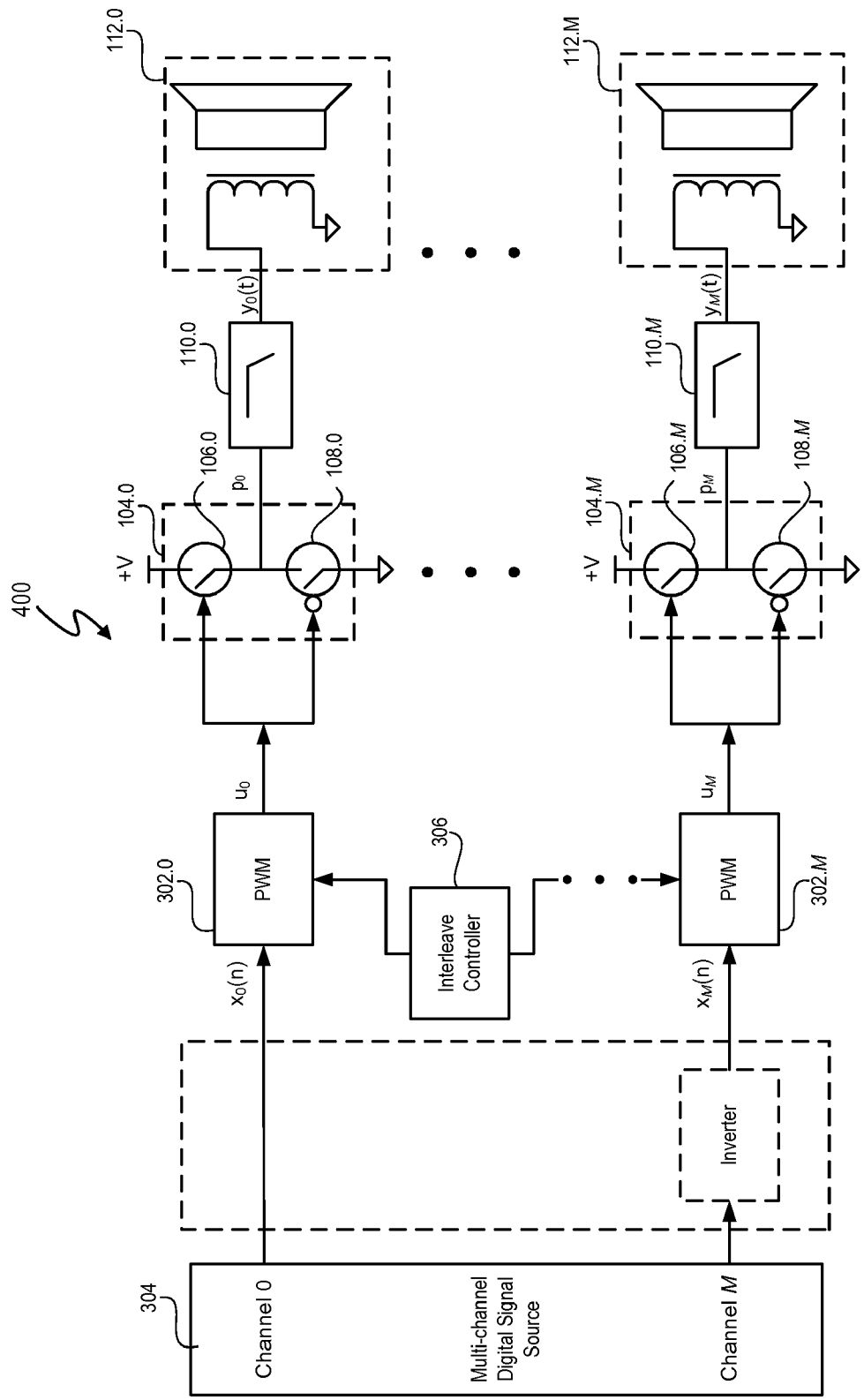
FIG. 4 depicts an exemplary multi-channel audio signal processing system.

FIG. 4 depicts an exemplary multi-channel audio signal processing system 400, which is one embodiment of multi-channel signal processing system 300. Multi-channel signal staggers selected pulse edges of PWM output signals $u_0 \ldots u_M$ in the same manner as multi-channel signal processing system 300. Multi-channel signal processing system 400 depicts the inverter subsystem 308 configured to indirectly invert selected PWM output signals $u_0 \ldots u_M$ by inverting input signals $x_0(n) \ldots x_M(n)$ prior to modulation by PWMs 302. Additionally channels 0 . . . M respectively include half-bridge amplifiers 104.0 . . . 104.M, low pass filters 110.0 . . . 110.M, and speakers 112.0 . . . 112.M, which operate as previously described.

Figure 5:
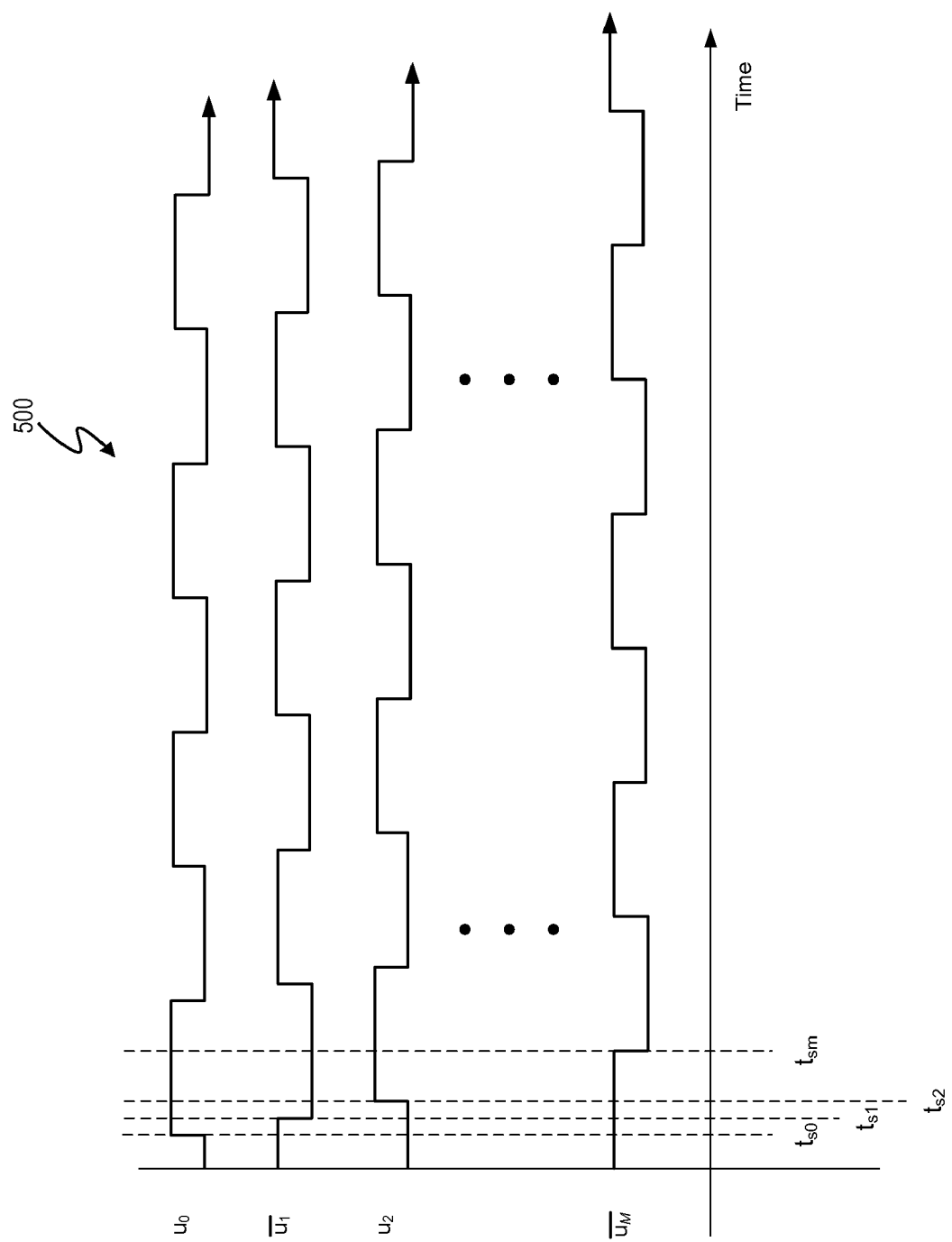
FIG. 5 depicts one embodiment of selected staggered and inverted multi-channel pulse width modulated output signals.
Figure 8:
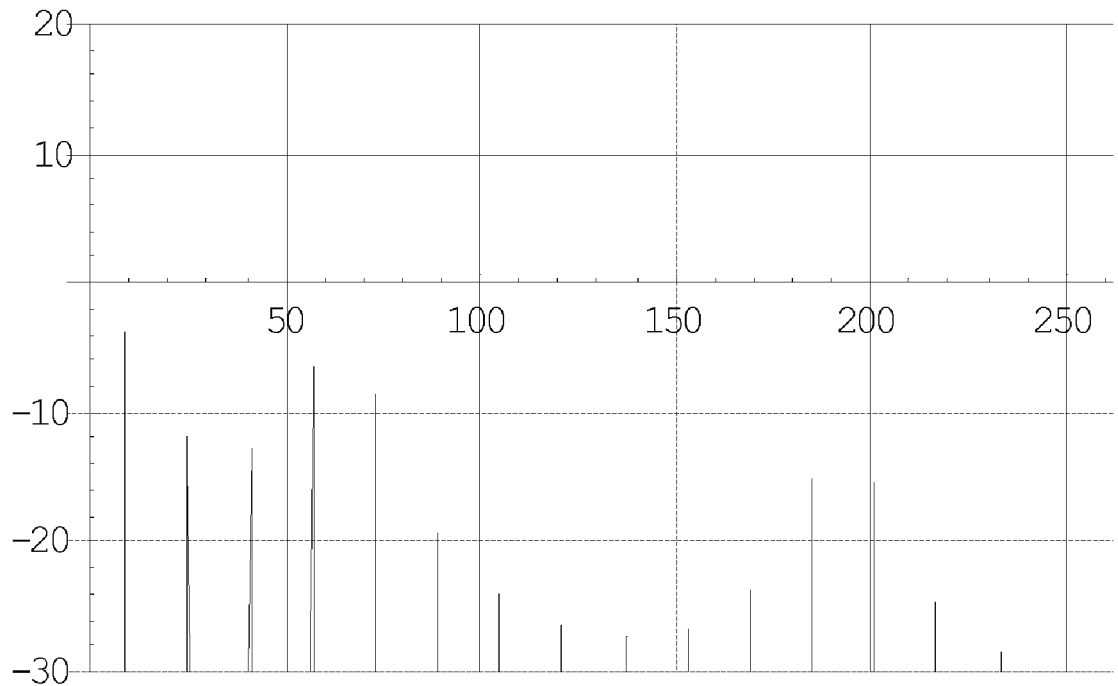

FIG. 5 depicts an exemplary timing diagram 500 of selected staggered and inverted multi-channel PWM output signals $u_0, \bar{u}_1, u_2, \ldots \bar{u}_M$ (the overstrike indicates an inverted signal). The leading and falling pulse edges of PWM output signals $u_1 \ldots \bar{u}_M$ are staggered relative to each other and relative to PWM output signal $u_0$ so that the leading edges of $u_0, \bar{u}_1, u_2, \ldots \bar{u}_M$ begin in overlapping frames at times $t_{s0}, t_{s1}, t_{s2}, \ldots t_{sM}$. In the timing diagram 500, the difference between adjacent times $t_{s0}, t_{s1}, t_{s2}, t_{sM}$ are the same and all represent a phase delay of PWM output signals $\bar{u}_1, u_2, \ldots \bar{u}_M$ relative to respective PWM output signals $u_1 \ldots u_{M-1}$. In other embodiments, one or more of times $t_{s0}, t_{s1}, t_{s2}, \ldots t_{sM}$ differ from the other times, and time differences represent phase delays, phase advances, or a combination of phase delays and phase advances.

The selection of which PWM output signals $u_0 \ldots UM$ to stagger and invert and the selection of stagger times determine, at least in part, the amount of EMI reduction achieved by multi-channel signal processing system 300. In at least one embodiment, the determination can be made by simulating an embodiment of multi-channel signal processing system 300 and empirically determining which of PWM output signals $u_0 \ldots u_M$ to stagger and invert and determine stagger times that minimize EMI by multi-channel signal processing system 300.

FIGS. 6 through 17 depict an exemplary stagger and inversion determination process 600 that evaluates various stagger and inversion configurations of PWM output signals $u_0 \ldots u_M$ to determine the better combination to reduce generated EMI. The stagger and inversion process and simulated results of FIGS. 6 and 16 relate to embodiments of multi-channel signal processing system 300. FIGS. 6-16 depict each of PWM output signal $u_0 \ldots u_M$ as "pwm[[x]]", where the "x" represents a normalized phase delay time value relative to a reference time such as the occurrence of a leading edge of the initial PWM output signal $u_0$, i.e. pwm[[1]] indicates no delay and is the reference from which the stagger of the other PWM output signals $u_0 \ldots$ UM are referenced, pwm[[2]] indicates a normalized phase delay of 1 unit of time (i.e. 2−1=1) relative to the leading edge of the first PWM output signal $u_0$, pwm [[3]] indicates a normalized phase delay of 2 units of time (i.e. 3−1=2) relative to the leading edge of the first PWM output signal $u_0$, and so on. FIGS. 6-16 indicate inversion and non-inversion by respectively inserting a "−" or a "+" prior to the output signal pwm[[x]]. FIG. 6 references eight channels, channels 0 . . . 7 and depicts staggering and inversion in the stagger and inversion selection 602 for channels 1 . . . 7 as:

pwm[[1]]+pwm[[2]]+pwm[[3]]+pwm[[4]]+pwm[[5]]+pwm[[6]]+pwm[[7]], which indicates a stagger of 1 normalized unit of time between each pulse leading edge and no inverted PWM output signals.

Stagger and inversion selection 604 is depicted as:

pwm[[1]]−pwm[[2]]+pwm[[3]]−pwm[[4]]+pwm[[5]]−pwm[[6]]+pwm[[7]], which indicates a stagger of 1 normalized unit of time between each pulse leading edge and inversion of alternating PWM output signals.

For a six channel embodiment of multi-channel signal processing system 300, stagger and inversion selection 606 in FIG. 13 depicts the better configuration of stagger and inversion for PWM output signals $u_0 \ldots u_5$ as respectively {pwm[[1]]−pwm[[2]]−pwm [[3]] + pwm [[4]] − pwm [[6]] + pwm [[7]]}. Determination of the better configuration depends on performance goals of multi-channel signal processing system 300. For example, different stagger and inversion configurations attenuate the amount of EMI at different frequencies. In at least one embodiment, if a certain frequency range or ranges are of particular concern for EMI, then the stagger and inversion configuration of PWM output signals $u_0 \ldots u_M$ can be targeted to particularly attenuate the PWM output signals $u_0 \ldots u_M$ within the certain frequency range or ranges.

Although the present invention has been described in detail, it should be understood that various changes, substitutions and alterations can be made hereto without departing from the spirit and scope of the invention as defined by the appended claims.

What is claimed is:

1. A method of processing pulse width modulated signals (PWM signals) in a multi-channel signal processing system, the method comprising:
   receiving N PWM signals for N-channels of the signal processing system, wherein N is an integer greater than one;
   staggering pulse edges of at least one of the PWM signals to prevent pulse edge overlap with at least one of the other PWM signals; and
   inverting at least one of the PWM signals.

2. The method of claim 1 further comprising:
   providing the PWM signals, including the staggered and inverted PWM signals, to respective half-bridge amplifiers;
   generating respective amplified PWM output signals from each of the half-bridge amplifiers; and
   filtering the amplified PWM output signals.

3. The method of claim 1 wherein staggering pulse edges of at least one of the PWM signals further comprises staggering pulse edges of all the PWM signals to prevent leading pulse edge overlap of all the PWM signals.

4. The method of claim 1 wherein staggering pulse edges of at least one of the PWM signals further comprises staggering pulse edges of at least three of the PWM signals to prevent leading pulse edge overlap of at least four of the PWM signals, wherein an amount of stagger is identical for all of the staggered PWM signals.

5. The method of claim 1 wherein staggering pulse edges of at least one of the PWM signals further comprises staggering pulse edges of at least three of the PWM signals to prevent leading pulse edge overlap of at least four of the PWM signals, wherein an amount of stagger differs for at least two of the staggered PWM signals.

6. The method of claim 1 wherein staggering pulse edges of at least one of the PWM signals to prevent pulse edge overlap with at least one of the other PWM signals further comprises delaying pulse edges of at least one of the PWM signals to prevent pulse edge overlap with at least one of the other PWM signals.

7. The method of claim 1 further comprising:
determining an amount of stagger between each staggered pulse edge and determining the PWM signals to invert to minimize electromagnetic interference associated with the PWM signals.

8. The method of claim 1 further comprising:
processing the PWM signals for multi-channel audio sound generation.

9. The method of claim 1 further comprising:
generating a modification signal to control the staggering of pulse edges.

10. The method of claim 9 wherein each pulse of each PWM signal has a pulse start time and a pulse end time relative to a beginning of a respective frame of each PWM signal and the modification signal causes pulse start times and pulse end times of the pulses to differ sufficiently from pulse start times and pulse end times of non-staggered pulse edges to reduce energy levels of at least the $3^{rd}$ and $5^{th}$ harmonic frequencies of the PWM signals by at least 3 dB relative to energy levels of the $3^{rd}$ and $5^{th}$ harmonic frequencies of PWM signals generated without staggering pulse edges.

11. The method of claim 9 wherein the modification signal comprises a random noise signal.

12. The method of claim 1 wherein staggering pulse edges of at least one of the PWM signals to prevent pulse edge overlap with at least one of the other PWM signals further comprises:
selecting a PWM pattern from a group of K patterns, wherein selection of the PWM pattern causes a rising edge of a first of the PWM signals to shift in time relative to a rising edge of a second of the PWM signals, wherein K is an integer greater than or equal to two.

13. A multi-channel signal processing system comprising:
a multi-channel pulse width modulation signal processor to generate pulse width modulated signals (PWM signals) for multiple channels;
an interleaving subsystem, coupled to the processor, to stagger pulse edges of at least one of the PWM signals to prevent pulse edge overlap with at least one of the other PWM signals; and
an inverter subsystem, coupled to the interleaving subsystem, to invert at least one of the PWM signals.

14. The multi-channel signal processing system of claim 13 further comprising:
a half-bridge amplifier coupled to the pulse width modulation signal processor to receive the PWM signals, including the staggered and inverted PWM signals, and generate respective amplified PWM output signals; and
a low-pass filter coupled to the half-bridge amplifier.

15. The multi-channel signal processing system of claim 13 wherein the interleaving subsystem is further configured to stagger pulse edges of all the PWM signals to prevent leading pulse edge overlap of all the PWM signals.

16. The multi-channel signal processing system of claim 13 wherein the interleaving subsystem is further configured to stagger pulse edges of at least three of the PWM signals to prevent leading pulse edge overlap of at least four of the PWM signals, wherein an amount of stagger is identical for all of the staggered PWM signals.

17. The multi-channel signal processing system of claim 13 wherein the interleaving subsystem is further configured to stagger pulse edges of at least three of the PWM signals to prevent leading pulse edge overlap of at least four of the PWM signals, wherein an amount of stagger differs for at least two of the staggered PWM signals.

18. The multi-channel signal processing system of claim 13 wherein the interleaving subsystem is further configured to delay stagger pulse edges of at least one of the PWM signals to prevent pulse edge overlap with at least one of the other PWM signals.

19. The multi-channel signal processing system of claim 13 further comprising:
an interleave controller to control staggering of the pulse edges of the PWM signals.

20. The multi-channel signal processing system of claim 13 further comprising:
a filter subsystem coupled to the inverter subsystem to filter the PWM signals; and
audio output devices coupled to the filter subsystem.

21. The multi-channel signal processing system of claim 13 further comprising:
a PWM output signal modifier to generate a modification signal to control the staggering of pulse edges.

22. The multi-channel signal processing system of claim 21 wherein each pulse of each PWM signal has a pulse start time and a pulse end time relative to a beginning of a respective frame of each PWM signal and the modification signal causes pulse start times and pulse end times of the pulses to differ sufficiently from pulse start times and pulse end times of non-staggered pulse edges to reduce energy levels of at least the $3^{rd}$ and $5^{th}$ harmonic frequencies of the PWM signals by at least 3 dB relative to energy levels of the $3^{rd}$ and $5^{th}$ harmonic frequencies of PWM signals generated without staggering pulse edges.

23. The multi-channel signal processing system of claim 21 wherein the modification signal comprises a random noise signal.

24. The multi-channel signal processing system of claim 13 wherein the interleaving subsystem is further configured to select a PWM pattern from a group of K patterns, wherein selection of the PWM pattern causes a rising edge of a first of the PWM signals to shift in time relative to a rising edge of a second of the PWM signals, wherein K is an integer greater than or equal to two.

25. A multi-channel signal processing system comprising:
means for receiving N pulse width modulated signals (PWM signals) for N-channels of the signal processing system, wherein N is an integer greater than one;
means for staggering pulse edges of at least one of the PWM signals to prevent pulse edge overlap with at least one of the other PWM signals; and
means for inverting at least one of the PWM signals.

* * * * *